(12) United States Patent
Montanini et al.

(10) Patent No.: US 8,124,865 B2
(45) Date of Patent: Feb. 28, 2012

(54) METHOD OF FABRICATION OF PLASTIC FILM SUPPORTED SINGLE CRYSTAL SILICON PHOTOVOLTAIC CELL STRUCTURE

(75) Inventors: Pietro Montanini, Melegnano (IT); Paolo Riboli, Civesio Frazione S. Giuliano Milanese (IT); Luca Zanotti, Agrate Brianza (IT); Michele Palmieri, Agrate Brianza (IT); Marta Mottura, Melegnano (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 1498 days.

(21) Appl. No.: 11/280,002

(22) Filed: Nov. 16, 2005

(65) Prior Publication Data

US 2006/0118164 A1  Jun. 8, 2006

(30) Foreign Application Priority Data

Nov. 19, 2004  (EP) .................................... 04425867

(51) Int. Cl.
   *H01L 31/02* (2006.01)
   *B05D 5/12* (2006.01)
(52) U.S. Cl. ......................................... 136/243; 427/74
(58) Field of Classification Search ...................... 427/74
   See application file for complete search history.

(56) References Cited

U.S. PATENT DOCUMENTS

| 5,320,685 A * | 6/1994 | Hilgarth et al. ............... 136/259 |
| 6,756,289 B1 | 6/2004 | Nakagawa et al. ........... 438/478 |
| 2002/0000242 A1* | 1/2002 | Matushiita et al. ........... 136/244 |

FOREIGN PATENT DOCUMENTS

EP   1024523   8/1999

OTHER PUBLICATIONS

"Porous Silicon Layer Transfer Processes for Solar Cells", Solanki et al., Solar Energy Materials and Solar Cells, Elsevier Science Publishers, Amsterdam, NL, vol. 83, No. 1, Jun. 1, 2004, pp. 101-113, XP004507474, ISSN: 0927-0248.

"High-Efficiency, Low-Cost Solar Cells on 3-Inch Silicon Wafers", Silard et al., International Journal of Electronics, Taylor and Francis Ltd. London, GB, vol. 65, No. 6, Dec. 1, 1988, pp. 1131-1136, XP000071042, ISSN: 0020-7217.

* cited by examiner

*Primary Examiner* — Kaj K Olsen
*Assistant Examiner* — Kourtney Salzman
(74) *Attorney, Agent, or Firm* — Allen, Dyer, Doppelt, Milbrath & Gilchrist, P.A.

(57) ABSTRACT

A method of fabricating a wafer-size photovoltaic cell module includes defining an integrated cellular structure of a light converting monolateral or bilateral junction diode in an epitaxially grown detachable layer including a first deposited metal current collecting terminal of the diode. The method also includes laminating onto the surface of the processed epitaxially grown detachable layer a film of an optical grade plastic material resistant to hydrofluoric acid solutions. The method further includes immersing the wafer in a hydrofluoric acid solution causing detachment of the epitaxially grown silicon layer laminated with the film, and polishing the surface of separation of the detached epitaxially grown layer and forming a second metal current collecting terminal of the diode by masked deposition of a metal at a temperature tolerable by the film.

16 Claims, 14 Drawing Sheets

METHOD OF FABRICATION OF PLASTIC FILM SUPPORTED SINGLE CRYSTAL SILICON PHOTOVOLTAIC CELL STRUCTURE

FIELD OF THE INVENTION

The invention relates in general to solar cells and more in particular to monocrystalline thin-film silicon cell.

BACKGROUND OF THE INVENTION

State-of-the-art photovoltaic devices are based on a PN junction in a semiconductor across which the photovoltage develops. Notwithstanding the non-ideal characteristics, silicon remains at present the semiconductor most used for photovoltaic conversion.

Solid-state physics shows that for a 90% light absorption, just 1 μm of GaAs (a direct semiconductor) would be necessary compared to 100 μm of monocrystalline Si. However, because of the well-developed techniques in fabricating silicon devices, silicon remains the most used semiconductor material, even for photovoltaic conversion.

The constant drive to increase higher and higher energy conversion efficiencies have led to several technological approaches for fabricating efficient photovoltaic cells. One of these approaches that is generally considered particularly promising is based on transferring thin monocrystalline silicon films from the surface of a "mother" silicon wafer onto a dielectric substrate. The basic idea of this approach is to detach a partially processed thin monocrystalline silicon layer from the surface of a common FZ-wafer and to transfer it onto a glass substrate.

The possibilities offered by fabrication techniques developed for integrating on silicon certain passive electrical and mechanical elements through a MEMS (Micro Etching Machining of Silicon) technology potentially permit definition of highly efficient integrated cell geometries of high efficiency. Moreover, the same starting wafer may be used several times as the "mother" wafer for forming a new light-trapping layer after polishing the release surface of the mother wafer and re-growing thereon a new epitaxial layer.

The known techniques of fabrication of photovoltaic panels proposed so far have significant drawbacks and shortcomings because of the processing complexity and cost to form a layer of silicon that may be safely detached from the surface of a monocrystalline mother wafer and transferred on a substantially rigid transparent dielectric substrate. The substantially rigid transparent dielectric substrate typically comprises a glass plate to which the detachable thin layer of silicon becomes permanently associated. This produces significant limitations on the ensuing steps of the fabrication process of photovoltaic panels because of the rigidity and unreplaceability of the transparent dielectric substrate on which the intrinsically fragile, partly defined thin crystalline silicon layer structure permanently bonded thereto is subjected to during the final steps of fabrication.

Considering optimal standard conditions, the radiation power at sea level per unit of area is about 1 kW/m$^2$, and considering a 20% efficiency for a monocrystalline silicon based photovoltaic panel, for a power yield of 1 kW, at least 5 m$^2$ of monocrystalline silicon are needed, which equals about 225 6-inch wafers, accounting for the overall area of typically round substrates. This implies a cost of USD 4000-5000 for just raw material of good quality. It is therefore evident there is a need of devising new fabrication processes capable of drastically reducing the overall costs of photovoltaic cells of enhanced efficiency realized on a monocrystalline silicon substrate.

SUMMARY OF THE INVENTION

These drawbacks, limitations, and disadvantages of known fabrication techniques are overcome or significantly reduced by the approach disclosed herein.

An object of the invention is to provide a fully defined wafer-size photovoltaic cell formed in a thin superficial layer epitaxially grown on the surface of a preprocessed monocrystalline silicon wafer, which includes a first metal current collecting terminal, that is eventually detached from the "mother" wafer together with a permanent nonrigid carrier film of optical grade plastic, deposited, bonded, or otherwise laminated onto the surface (back or rear surface) of the defined photovoltaic cell structure, before detaching it from the mother wafer. The optical grade transparent plastic carrier film may remain permanently associated with the rear surface of the functional silicon integrated structure, and though being relatively flexible, has sufficient mechanical strength such to permit easy and risk-free handling of the detached wafer-size photovoltaic cell module realized in the relatively thin strippable epitaxially grown silicon layer, for example. The qualification "optical grade" may signify that the plastic material has a transparency of at least 90% in the visible spectrum and a reflection lower than about 5% and other definitions of "optical grade are possible as will be appreciated by those of skill in the art. Polymethylmetacrylate (PMMA) or Polycarbonate (PC) being examples of usable materials.

The detached wafer-size photovoltaic cell module comprises an integrated photodiode having a cellular array structure completely defined in the strippable silicon layer, and bonded to an optical grade plastic film, undergoes the final (finishing) operations that may include a mechanical polishing of the separation surface of the detached layer (to become the front side of the photovoltaic cell to be illustrated), with front side metal deposition and patterning to form second photodiode contacts and relative current collecting terminals, followed by deposition of an anti-reflective film, and other steps as will be appreciated by those of skill in the art. Metallization for creating the second current collecting terminal of the diode on the polished detach surface may be carried out with a low temperature lift-off and evaporation process that is thermally compatible with the presence of the carrier film of optical grade plastic. Eventually, the completely finished wafer-size photovoltaic cell module, supported by a carrier film of optical grade plastic, is disposed, alone or more likely together with other identical supported wafer-size photovoltaic cell modules, on a rigid substrate. The rigid substrate may be transparent or opaque, and in the form of a rooftop panel, a structural glass or transparent plastic covering element, a window panel or the like.

When fixed on the outer or inner surface of a transparent roofing or similar architectural element, each optical grade plastic film supported wafer-size photovoltaic cell module, provided with the first current collecting metal terminal formed on its rear surface purposely realized with an open (grid like) layout, specularly similar to the second current collecting metal terminal formed on the front surface of the silicon integrated photodiode structure, behaves as a double-face photovoltaic device. In practice, the photovoltaic cell may convert the light illuminating its front face as well as the light that illuminate its rear face, which is transmitted through the optical grade plastic carrier film permanently laminated over its rear surface.

According to this invention, a wafer-size photovoltaic cell module comprises an integrated photodiode having a cellular array structure that is defined in a pre-formed silicon layer capable of being detached from the "mother" wafer. Having thus carried out all the contemplated processing steps that need to be conducted at relative high temperature, a permanent transparent plastic film resistant to hydrofluoric acid solutions such as PMMA (Polymethylmetacrylate) or PC (Polycarbonate) or similar optical grade plastic material is laminated onto the surface of the processed silicon wafer.

The transparent plastic film, generally of thickness generally comprised between 0.5 and 1.00 mm and permanently associated to the strippable silicon layer, provides an effective mechanical support to the intrinsically fragile processed silicon layer and facilitates the stripping of the defined silicon layer off the surface of the mother silicon wafer. The transparent plastic film also confers to the laminated object when separated from the mother wafer, adequate mechanical strength that permits substantially risk free handling in carrying out the finishing steps of the fabrication process flow of the wafer-size photovoltaic cell module, and in the subsequent storing and handling of fully functional plastic supported photovoltaic cell modules for constructing light converting panels. The supporting plastic carrier film is ideally suited in providing a bond surface that may be glued or otherwise fixed onto a rigid structural substrate. Alternatively, the wafer-size module may be bonded with its front face on the surface of a transparent structural element. Even a bi-adhesive tape may be used to fix the plastic carrier film supported modules onto a substantially flat rigid panel with the advantage that the wafer-size photovoltaic cell module may eventually be peeled off the panel without damage and re-used by fixing it onto the same or a different panel or similar structural elements as needed.

According to a first embodiment, each wafer-size photovoltaic cell module that is separated from the mother wafer remains supported by a sufficiently thick film of optical-grade plastic material, and may be handled and eventually disposed on a mechanical rigid support along with similarly supported wafer-size modules. Such modules may be interconnected according to a desired series-parallel arrangement to define a photovoltaic cell panel of a desired power handling capacity.

Alternatively, it may be possible to permanently bond or laminate a plurality of wafer-size photovoltaic cell modules to a single sheet of optical grade plastic material to define a relatively flexible and mechanically strong photovoltaic multicell element. For example, a strip including a certain number of wafer size cell modules of a relatively large capacity may be disposed and fixed onto the surface of a rigid supporting panel such as a glass panel of adequate area in a single operation.

In either case, the fixing of the photovoltaic cell module, including a permanently associated optical grade plastic carrier film on the rear surface of the silicon integrated active structure, may be done by gluing or otherwise fixing the supported element onto a substantially flat rigid structural element. Preferably, the fixing may be done by using a bi-adhesive tape or film. This permits the peeling off of the plastic carrier film supported active silicon structure from a surface of the rigid structural element to permit the fixing of the same cell module onto a different structural support should the need arise.

In fact, the assembling of fully defined wafer-size active silicon photovoltaic modules supported on a carrier film of optical grade plastic allows a moderate flexing of the laminated body without destroying the supported active silicon structure.

Basically, the process of this invention combines certain peculiar characteristics of known processing techniques for realizing so-called SOI (Silicon On Insulator) substrates with integration techniques of power devices on a crystalline silicon substrate such as power diodes having a cellular array structure on silicon. Moreover, the formation of an optical grade plastic carrier layer over the rear side of the fully defined strippable superficial layer of the mother silicon wafer not only facilitates the stripping operation, but provides a permanently laminated carrier film of optically transparent material that facilitates the finishing operations to be performed on the separation surface of the defined integrated structure, the subsequent storage of fully functional modular wafer-size photovoltaic cell arrays, and the possibility of fixing one or several of them on a rigid structural panel that may be transparent or opaque depending on architectural design choices of the photovoltaic conversion panels.

The invention is defined in the annexed claims.

DETAILED DESCRIPTION OF THE PREFERRED EMBODIMENTS

Figure 1:
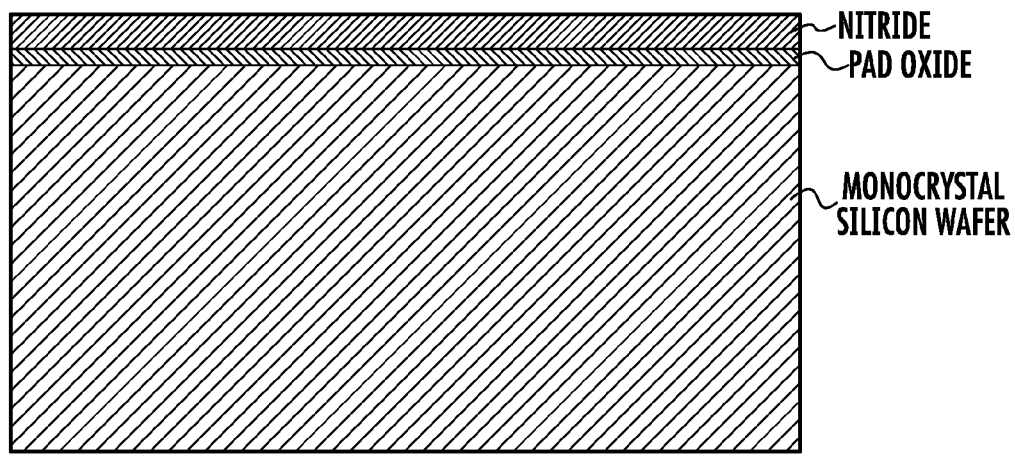
FIGS. 1 to 16 illustrate the basic sequence of silicon processing steps for producing a detachable SOI substrate layer on the surface of a monocrystalline silicon wafer in accordance with the invention.

The FIGS. 1 to 16 illustrate the processing steps through which a detachable layer of epitaxially grown monocrystalline silicon of a thickness of few $\mu m$ is formed. The thickness may be between 3 and 30 $\mu m$. With reference to FIG. 1, the starting monocrystalline silicon substrate may have any bulk resistivity. The first step includes the formation on the surface of the silicon wafer of a hard mask composed by a multilayer stack of a first oxide layer (for example a pad oxide layer of about 20 nm), a deposited nitride (for example a layer of about 140 nm), and topped by a superficial deposited oxide layer (for example a layer of about 400 nm) as depicted in FIG. 1.

Figure 2:
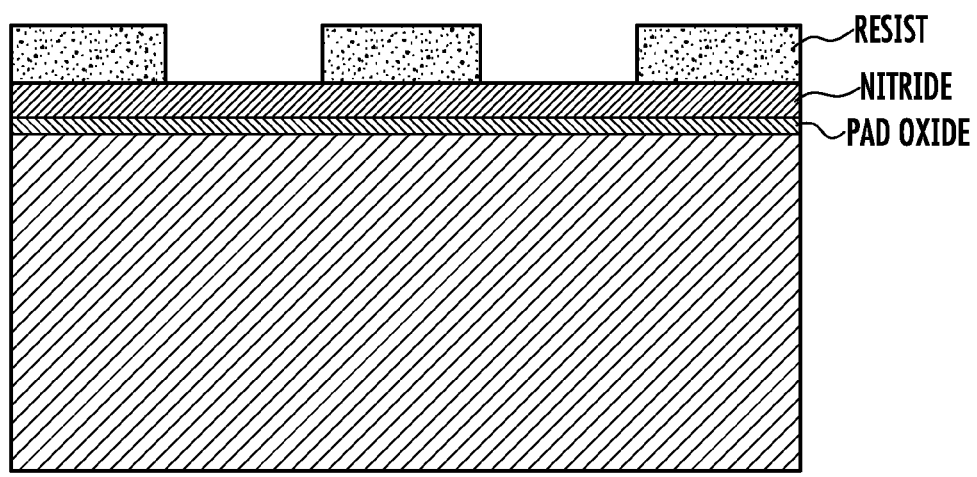
Figure 3:
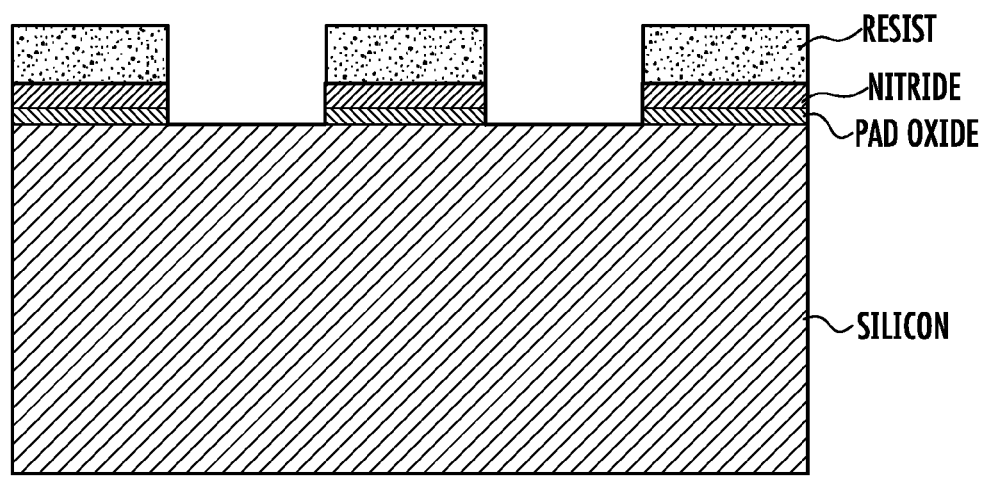

This multilayer stack may be defined by ordinary photolithographic technique using a resist mask as depicted in FIG. 2. Finally, the multilayer hard mask stack is plasma etched through the opening of the resist mask as depicted in FIG. 3. These steps define a reticulated geometry of square cells having a constant pitch not in excess of about 3 $\mu m$, for example.

Figure 4:
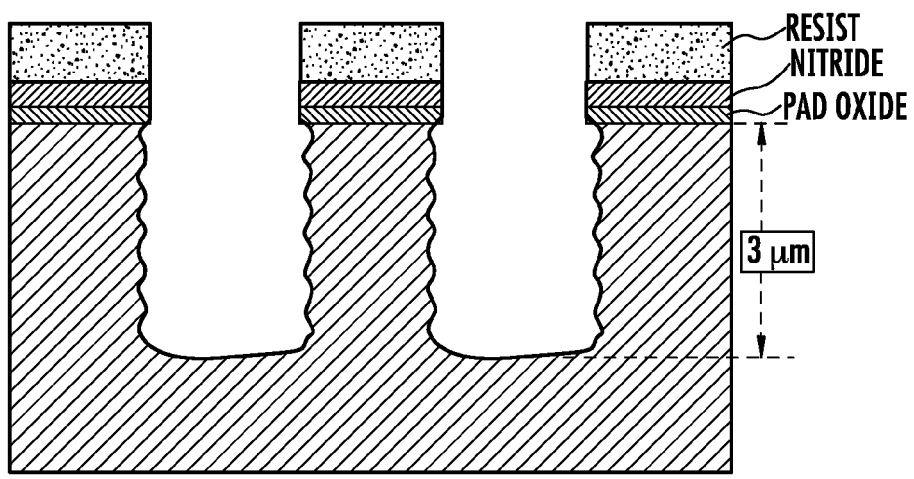
Figure 5:
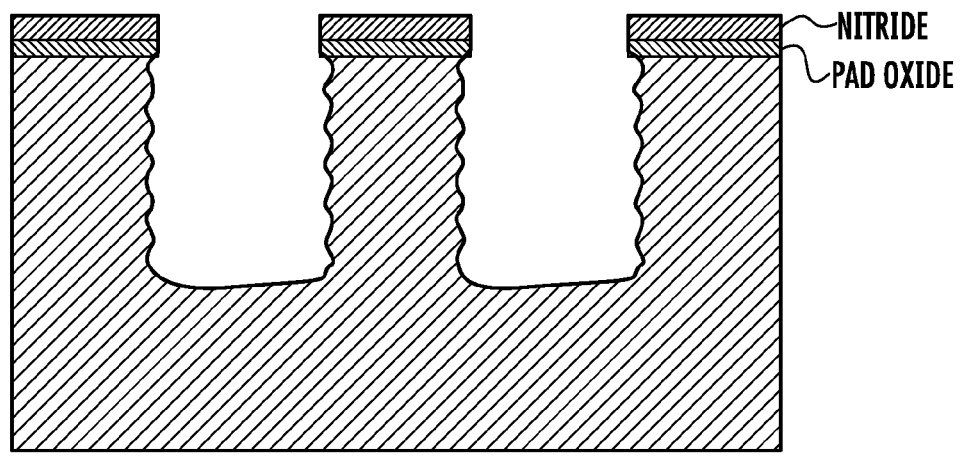
Figure 6:
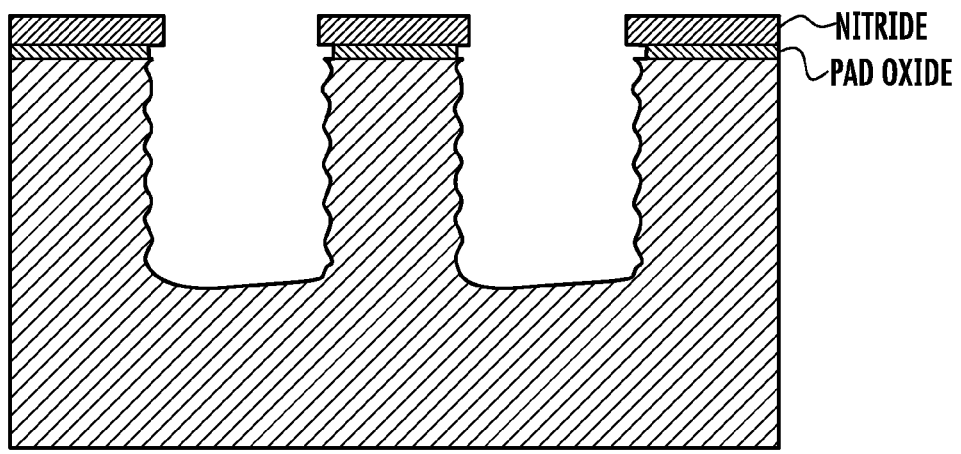

The so defined cellular geometry is thereafter transferred in the silicon substrate by an anisotropic dry etching step that is protracted until forming crossing trenches in the silicon having a depth of several $\mu m$ that is generally between 3 and 5 $\mu m$ as depicted in FIG. 4. Thereafter, the resist mask is removed, as shown in FIG. 5, and a brief wet etching of the pad oxide layer underlying the nitride layer is carried out in order to create a small undercut immediately under the definition edge of the nitride layer, as depicted in FIG. 6.

Figure 7:
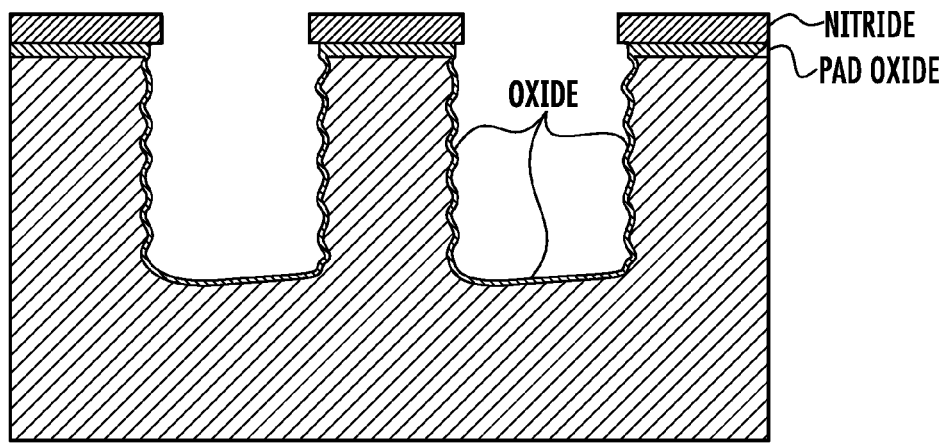
Figure 8:
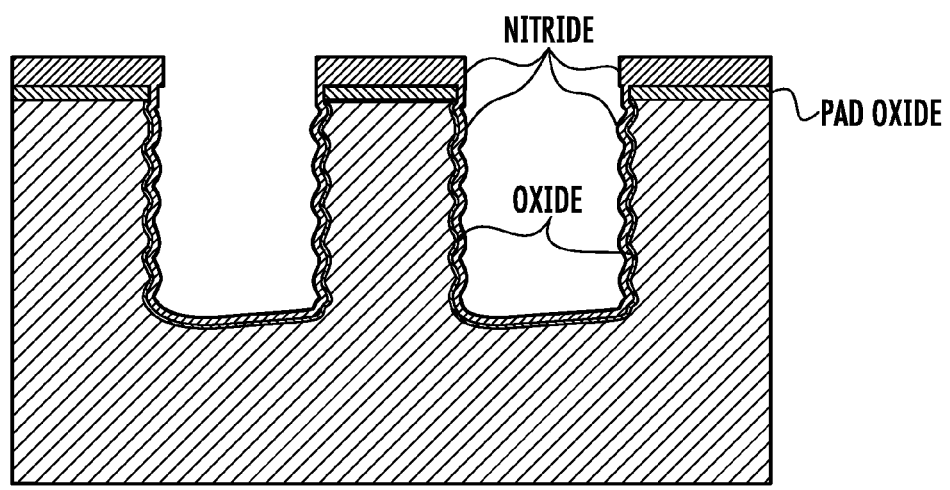
Figure 9:
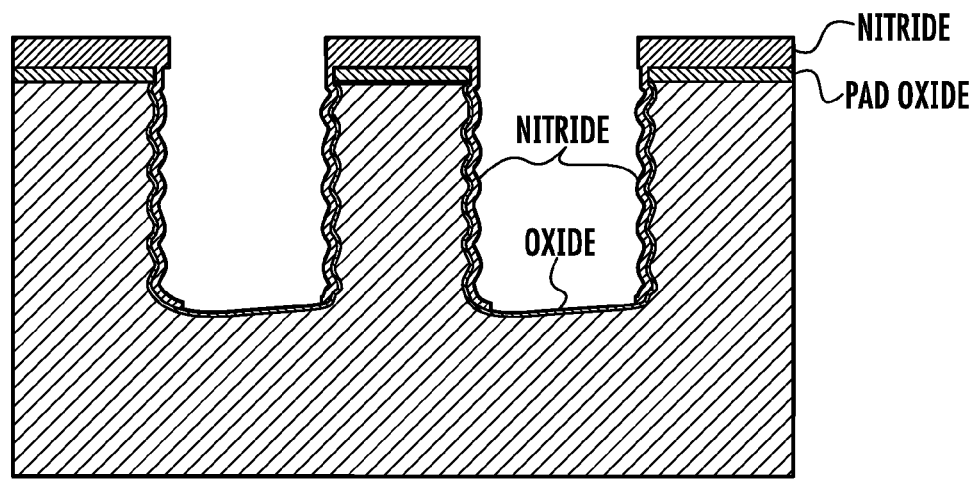

The following step depicted in FIG. 7 comprises thermally oxidizing the silicon over the etch surfaces of the trenches. Thereafter, a second nitride deposition step is performed as depicted in FIG. 8. The next step comprises dry etching the nitride deposited in the preceding step under strongly anisotropic conditions in order to remove completely the nitride from the bottom of the trenches, thus exposing the underlying oxide layer only at the bottom of the trenches, as depicted in FIG. 9.

Figure 10:
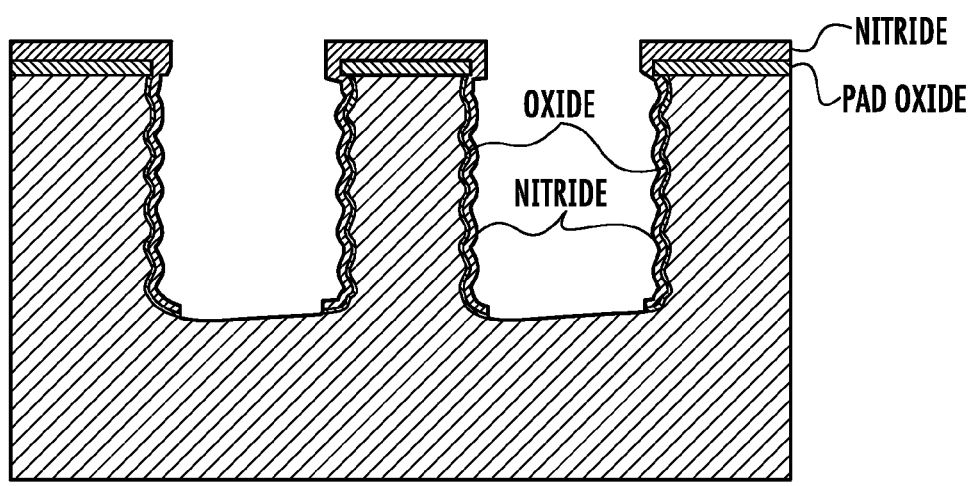
Figure 11:
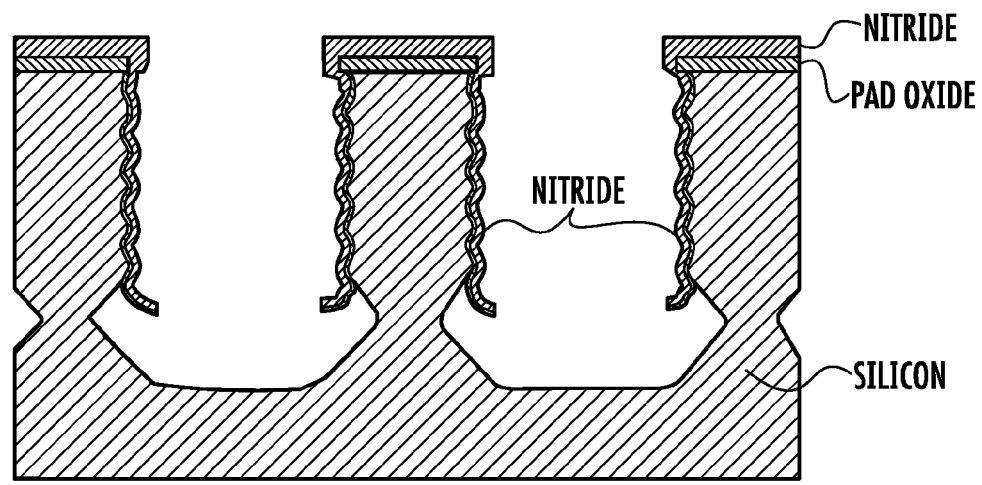

The so-exposed oxide layer at the bottom of the trenches is wet etched, as depicted in FIG. 10, and this wet etching step is immediately followed by a wet (isotropic) etching of the silicon, as depicted in FIG. 11. The isotropic wet etching of silicon is left to progress at the bottom of the trenches since the vertical walls of the trenches and the top surface of the wafer are still protected by the residual nitride layer and underlying oxide.

Figure 12:
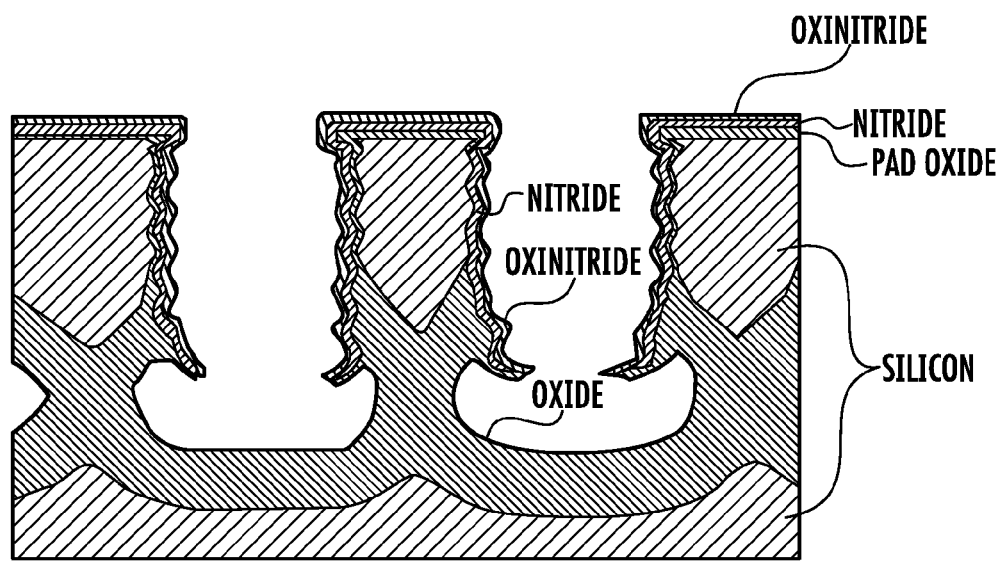
Figure 13:
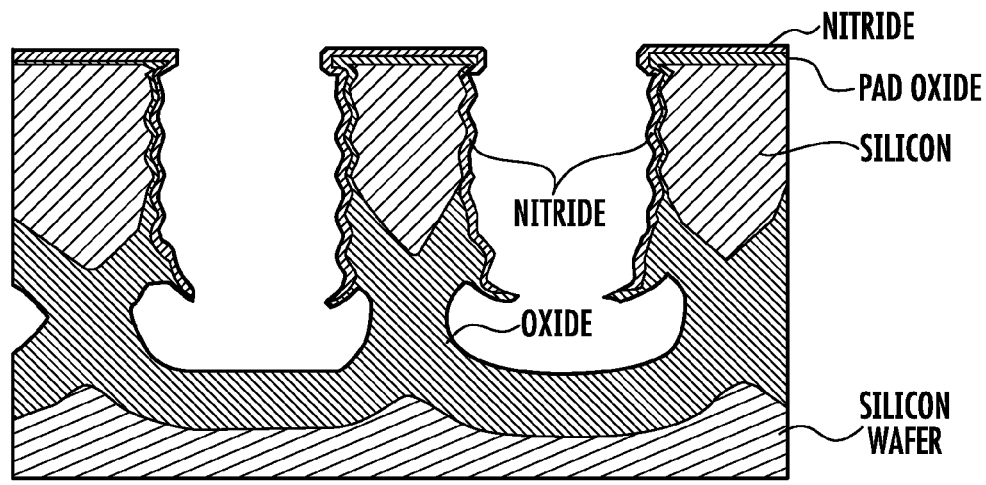
Figure 14:
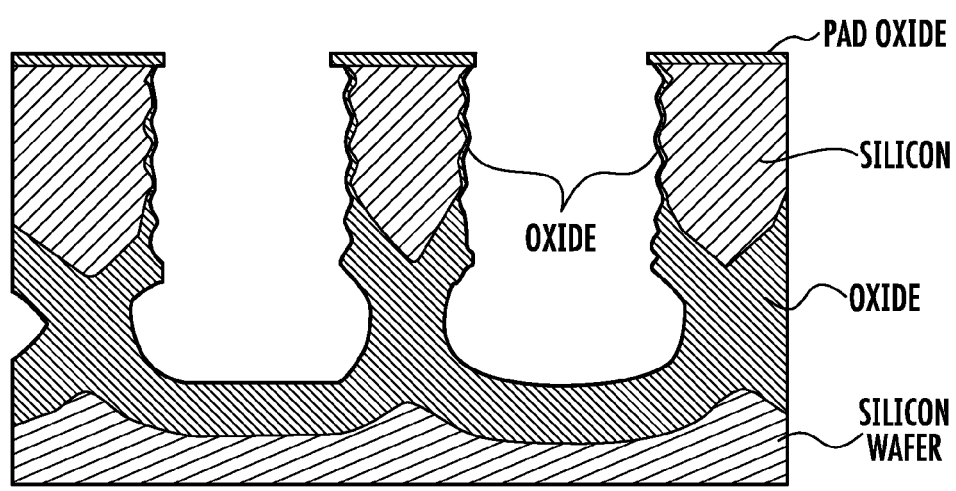

In FIG. 12, the wafer is subjected to a protracted thermal oxidation of silicon in an oven until the oxidation of silicon extends across the residual thickness of the silicon pillars at the base thereof, where the progression of the oxidation of silicon is not restrained by the presence of the nitride. The part of the nitride layer that has converted to oxide during the preceding oven treatment is wet etched off as depicted in FIG. 13 and thereafter the residual nitride is completely removed by wet etching, as depicted in FIG. 14.

Figure 15:
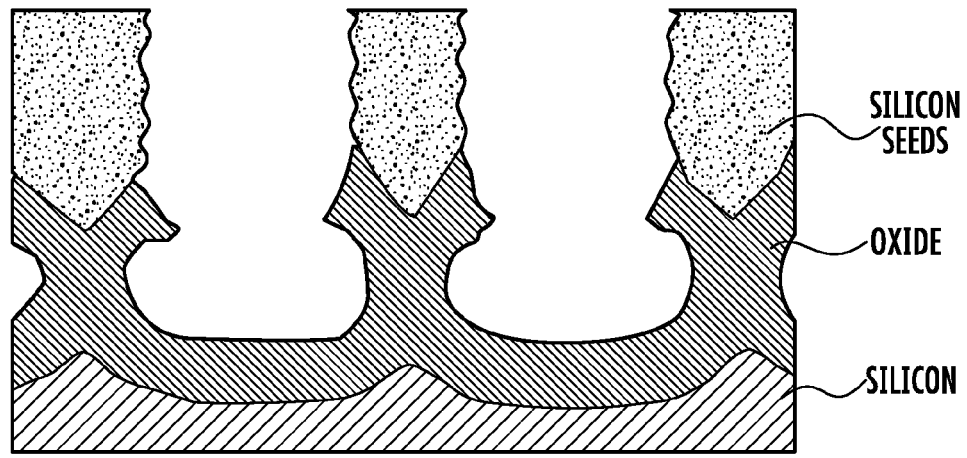
Figure 16:
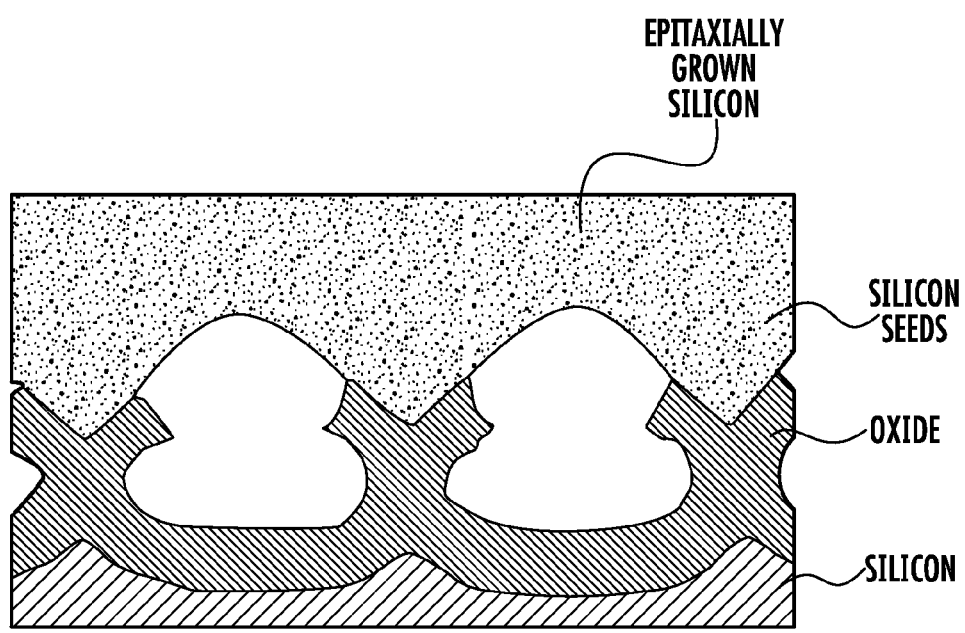

The pad oxide layer is then removed from the surface of the wafer as depicted in FIG. 15, and on the wafer is grown an epitaxial layer of silicon as depicted in FIG. 16. The epitaxial growth nucleates over the monocrystalline silicon seeds that are isolated from the underlying silicon substrate by the oxidized base of the pillars. Upon epitaxially growing a few microns of silicon, the growing layer bridges the gaps among the starting seeds and becomes continuous thus realizing a SOI layer that may thereafter be detached from the mother silicon wafer.

The above described processing steps depicted in FIGS. 1 to 16, illustrate a preferred technique for realizing a detachable SOI layer on a monocrystalline silicon wafer. Any other known technique may be used for forming such a detachable SOI layer of a thickness generally comprising between 10 and 30 μm.

At this point, definition of an integrated diode structure in the so defined SOI layer begins. The Figures from 17 to 24 illustrate the process steps according to a first embodiment of this invention.

Figure 17:
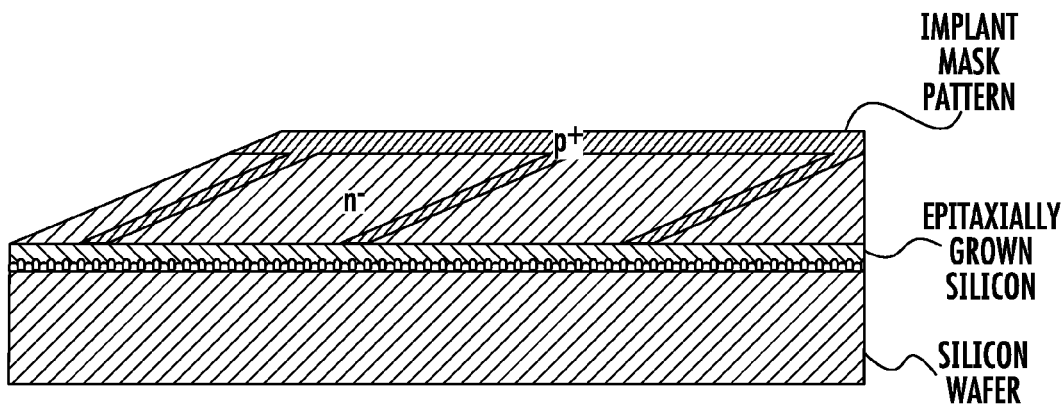
FIGS. 17 to 24 illustrate the processing steps of definition of an integrated structure of a light converting diode in the detachable superficial silicon layer, according to a first embodiment of the invention.
Figure 18:
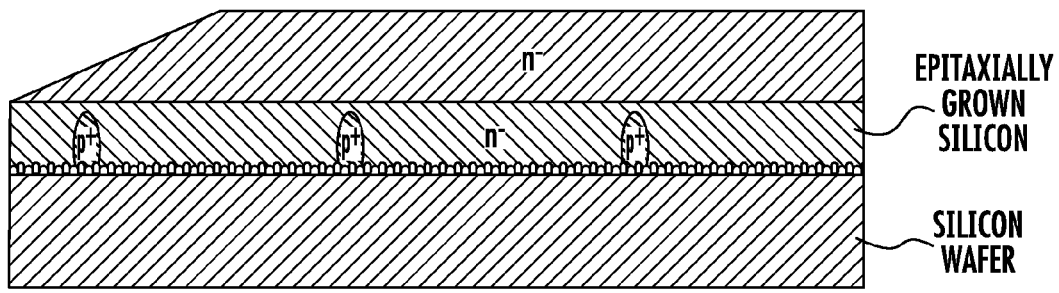

A first step of the processing sequence of defining integrated photo diodes in the SOI layer comprises, as depicted in FIG. 17, in a masked deep implant of boron in the SOI substrate for realizing a rectangular grid geometry of the integrated photodiode with main direction current collection backbones and orthogonal fingers departing therefrom, spaced by few hundreds of μm. Thereafter, an $n^-$ epitaxial growth is conducted to form an epitaxial $n^-$ layer of about 10-30 μm of thickness with a bulk resistivity comprising between 10 and 100 Ωcm. This epitaxial growth step is conducted at relatively high temperature and determines the diffusion of the previously implanted boron (p-type dopant), as depicted in FIG. 18.

Figure 19:
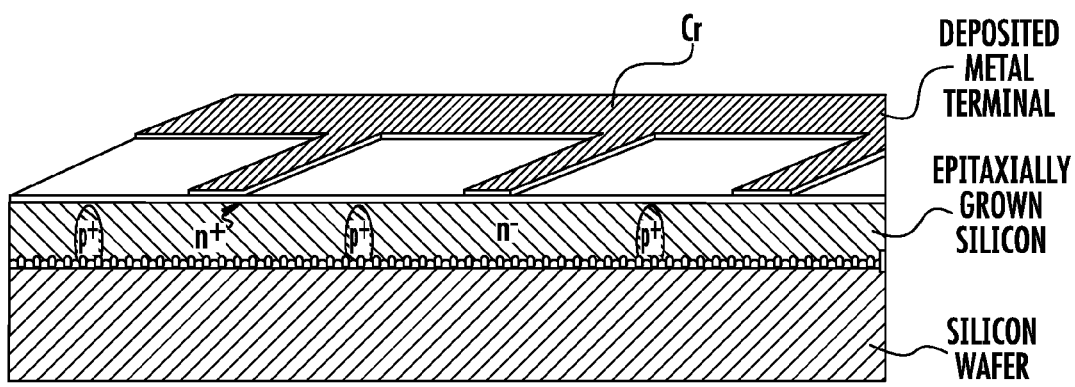

Thereafter, an $n^+$ implant and subsequent diffusion of the implanted dopant are performed to form a superficial $n^+$ layer of a few microns of thickness to ensure a good electrical contact with a subsequently deposited metal, generally a chromium layer, as depicted in FIG. 19. These steps, including the metal deposition may be carried out on the whole (unmasked) surface of the wafer. Preferably, a double face photovoltaic cell is realized by forming a current collecting terminal with an "open" layout of backbone lines and narrower branch lines, as shown in FIG. 19, using an appropriate mask, similar to the one used for realizing the boron implant for the buried $p^+$ regions shown in FIG. 17, in order to limit the opacized area of the so patterned current collecting metal structure of a first connectable terminal on what may be defined as the back side of the integrated photodiode structure.

Figure 20:
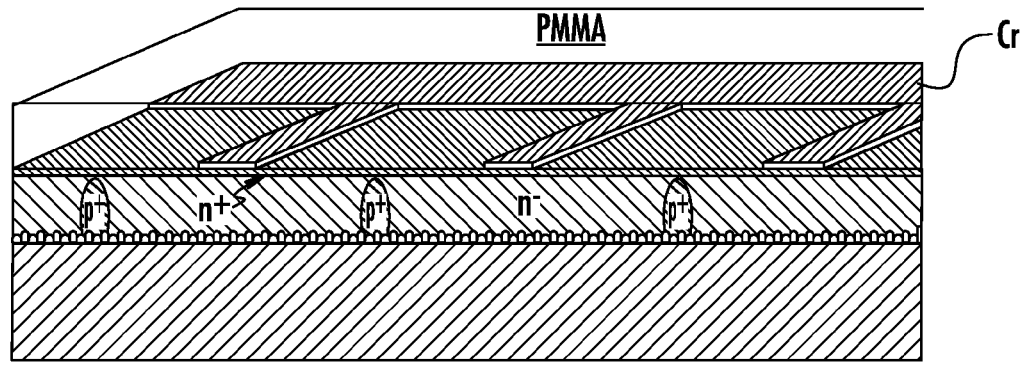

At this stage, a film of optical grade transparent plastic material, for example a film of PMMA (Polymethylmetacrylate) or a film of PC (Polycarbonate) of a thickness generally comprising between 0.5 and 1.5 mm, is bonded onto the wafer by application of heat and pressure or by superficial chemical melting of the plastic film with an organic solvent before pressing it onto the surface of the processed wafer, or by other equivalent known techniques for bonding it to the silicon wafer, as depicted in FIG. 20. The laminated transparent plastic film is of a material that is essentially resistant to hydrofluoric acid solution.

In the laminated transparent plastic film may already be defined holes in coincidence with contact areas of the previously deposited (patterned) metal layer that defines one of the two terminals of the integrated photodiodes structure. Through these contacts the wafer-size photovoltaic cell module will be eventually connected in the electrical circuit of the photovoltaic panel by common electrical connection techniques.

Figure 21:
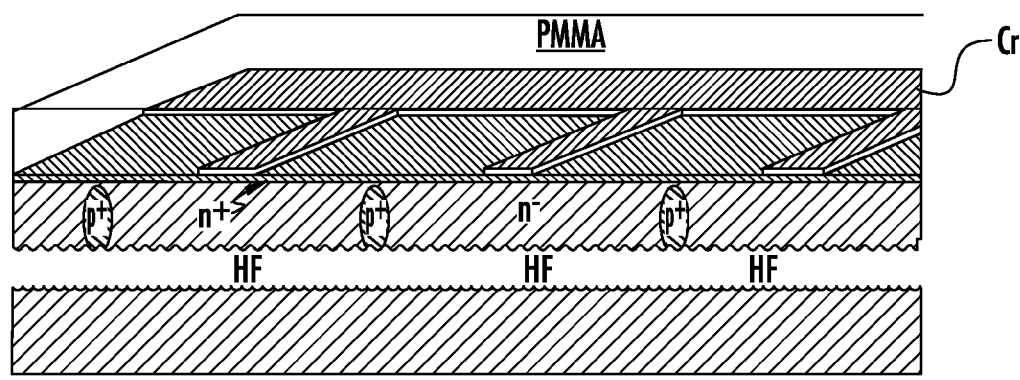

The integrated power diode structure defined in the SOI layer and the mechanical supporting film (carrier film) of optical grade plastic permanently laminated onto the surface of the SOI layer are separated from the underlying silicon mother wafer by immersing the wafer in a hydrofluoric acid bath that leaches away the oxidized silicon bases of the silicon pillars determining the release of the plastic supported SOI layer from the originating silicon substrate (mother wafer) that is preserved for further use. This step is depicted in FIG. 21.

The detached SOI layer, prelaminated to a supporting transparent plastic film, becomes what can be defined as a silicon on plastic (SOP) structure. In fact, the finishing steps are thereafter conducted on such a SOP structure.

Figure 22:
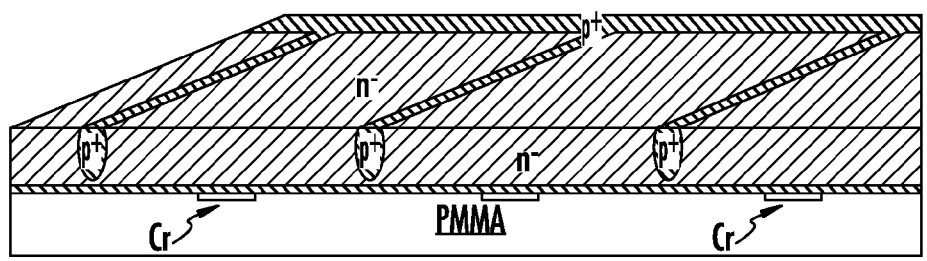
Figure 23:
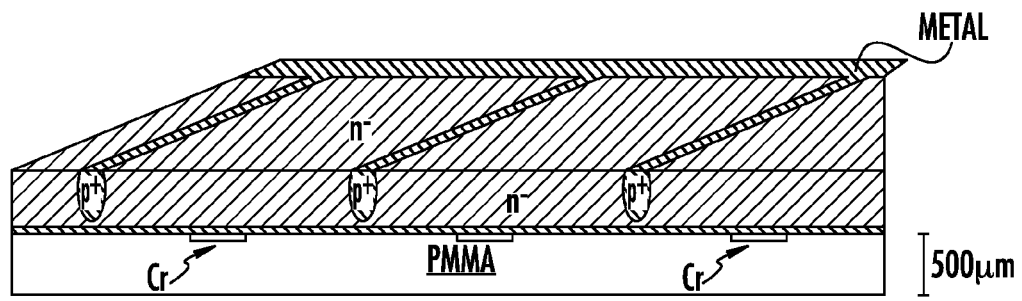

As depicted in FIG. 22, the release surface of the supported silicon layer is polished. By appropriate masking, the second current collecting structure of the integrated diode is formed by performing a relatively low temperature metallization, according to a lift-off and evaporation technique that is thermally compatible with the presence of the laminated plastic film substrate, as depicted in FIG. 23.

Figure 24:
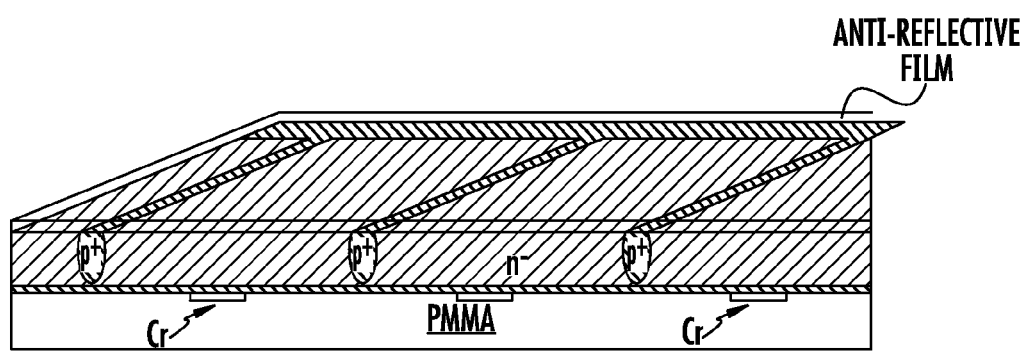

The current collecting backbone and branch lines of the so completed front side metallization are formed directly over, and in electrical contact with, the polished surface of the $p^+$ diffused regions to define the second terminal of the integrated photodiode. A final step, depicted in FIG. 24, may comprise depositing over the whole front side surface of the wafer-size photovoltaic cell module an antireflecting layer, for example a layer of titanium dioxide, in order to minimize yield losses caused by surface reflection.

Figure 25:
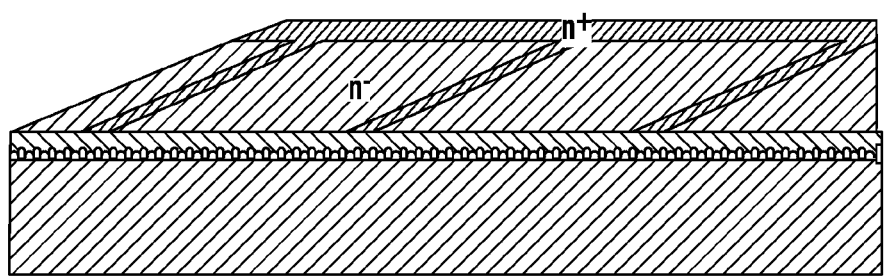
FIGS. 25 to 32 illustrate the processing steps of definition of an integrated structure of a light converting diode in the detachable superficial silicon layer, according to an alternative embodiment of the invention.

As may be observed, according to this first embodiment, the active photovoltaic converting device is defined by a monolateral junction diode $p^+/n^-$, wherein the relatively high resistivity of the epitaxially grown $n^-$ layer ensures an extended depletion region for a high cell efficiency. The Figures from 25 to 32 illustrate the process steps according to an alternative embodiment of this invention. A first step of the processing sequence of defining integrated photo diodes in the SOI layer comprises, as depicted in FIG. 25, in a masked implant of arsenic/phosphorus/antimony on the SOI substrate to realize a rectangular grid geometry of the integrated photodiode with main direction current collection backbones and orthogonal fingers departing therefrom, spaced by few hundreds of am.

Figure 26:
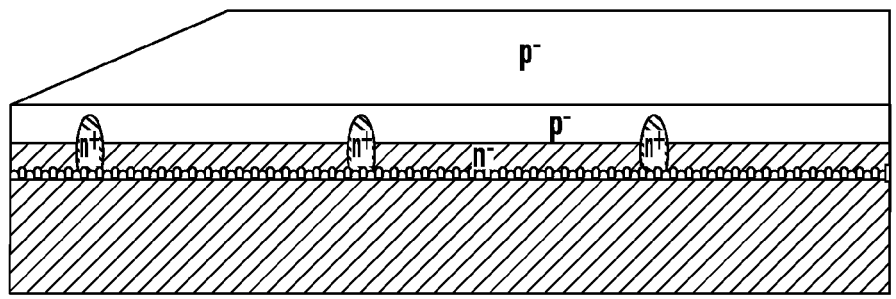

Thereafter, a p⁻ epitaxial growth is conducted to form an epitaxial p⁻ layer of about 10-30 μm of thickness with a bulk resistivity comprising between 10 and 100 Ωcm. This epitaxial growth step conducted at relatively high temperature also determines the diffusion of the previously implanted n-type dopants, as graphically depicted in FIG. 26.

Figure 27:
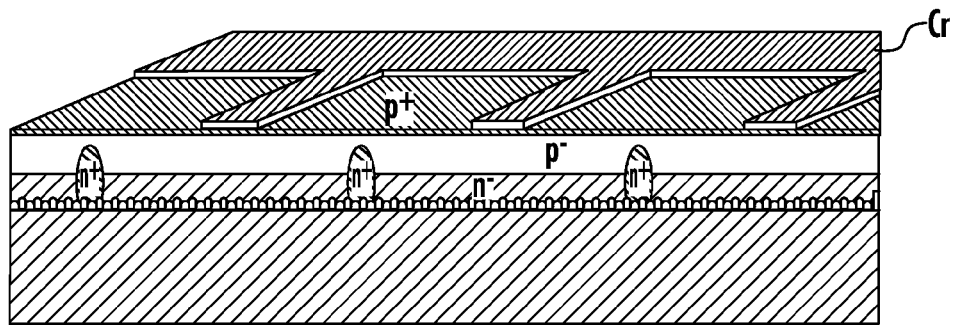

Thereafter, an p⁺ implant and subsequent diffusion of the implanted dopant are performed to form a superficial p⁺ layer of a few microns of thickness to ensure good electrical contact with a subsequently deposited metal such as a chromium layer, as depicted in FIG. 27. These steps, including the metal deposition, may be carried out on the whole (unmasked) surface of the wafer. Preferably, a double face photovoltaic cell is realized by forming a current collecting terminal with an "open" layout of backbone lines and narrower branch lines, as shown in FIG. 27 using an appropriate mask, which is similar to the one used for realizing the deep n-type dopant implant for the buried n⁺ grid regions shown in FIGS. 25-26 to limit the opacized area of the so patterned current collecting metal structure of a first connectable terminal onto what may be defined the back side of the integrated photodiode structure.

Figure 28:
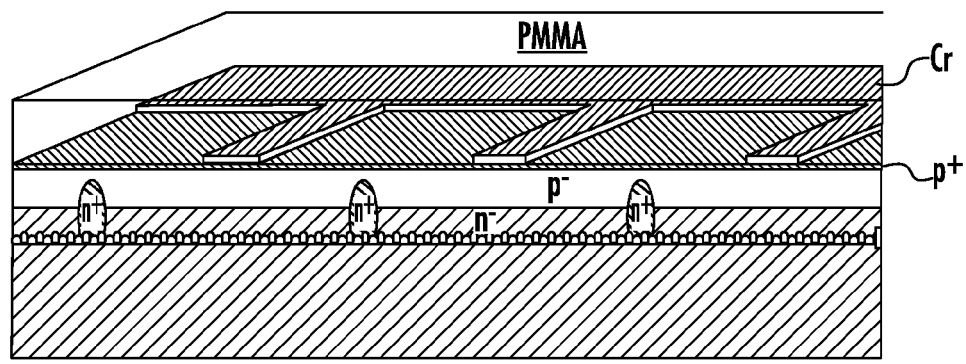

At this stage, a film of optical grade plastic material, for example a film of PMMA (Polymethylmetacrylate) or a film of PC (Polycarbonate) of a thickness generally comprising between 0.5 and 1.5 mm, is bonded onto the wafer by application of heat and pressure or by superficial chemical melting of the plastic film with an organic solvent before pressing it onto the surface of the processed wafer, or by other equivalent known techniques for bonding it to the silicon wafer, as depicted in FIG. 28. The laminated transparent plastic film is of a material that is essentially resistant to hydrofluoric acid solution.

In the laminated transparent plastic film may already be defined holes in coincidence with electrical connection areas or pads of the previously deposited (optionally patterned according to an open layout comprising backbone lines and branch lines) metal layer that defines the first of the two terminals of the integrated photodiodes structure present on the back or rear side of the processed epitaxially grown layer. Through these the wafer-size photovoltaic cell module will be eventually connected in the electrical circuit of the photovoltaic panel by common electrical connection techniques.

Figure 29:
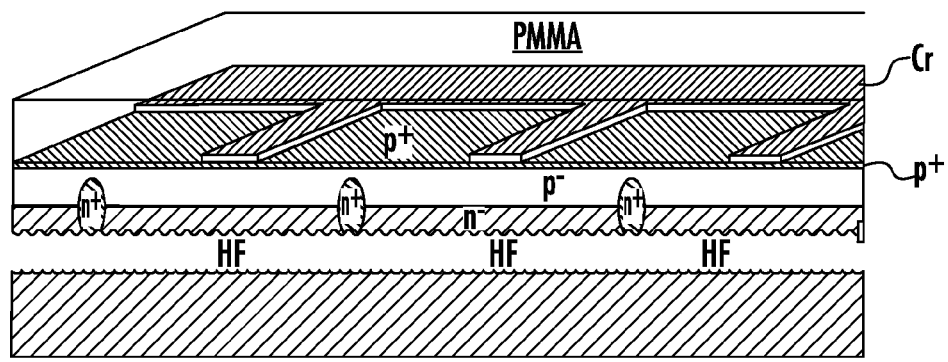

The integrated power diode structure defined in the SOI layer and the mechanical supporting film (carrier film) of optical grade plastic permanently laminated onto the surface of the SOI layer is separated from the underlying silicon mother wafer by immersing the wafer in a hydrofluoric acid bath that leaches away the oxidized silicon bases of the silicon pillars determining the release of the plastic supported SOI layer from the originating silicon substrate (mother wafer) that is preserved for further use. This step is depicted in FIG. 29.

The detached SOI layer, prelaminated to a supporting transparent plastic film, becomes what can be defined as a silicon on plastic (SOP) structure. In fact, the finishing steps are thereafter conducted on such a SOP structure.

Figure 30:
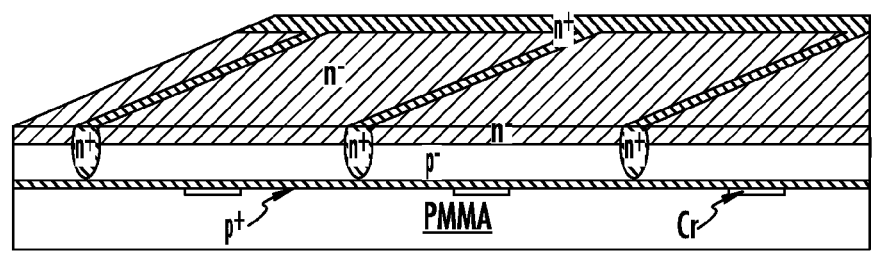
Figure 31:
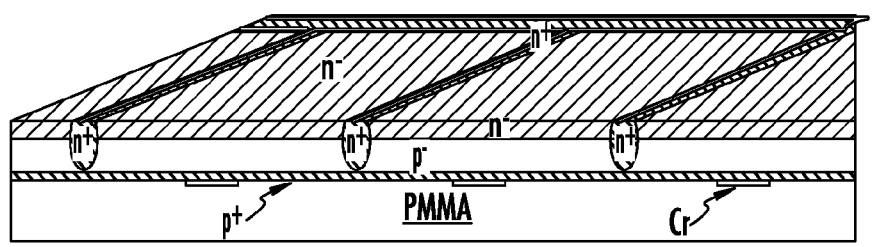

As depicted in FIG. 30, the release surface of the supported silicon layer is polished. By appropriate masking, the second current collecting structure of the integrated diode is formed by performing a relatively low temperature metallization, according to a lift-off and evaporation technique that is thermally compatible with the presence of the laminated plastic film substrate, as depicted in FIG. 31.

The current collecting backbone and branch lines of the so completed front side metallization are formed directly over, and in electrical contact with, the polished surface of the n⁺ diffused grid regions to define the second terminal of the integrated photodiode.

Figure 32:
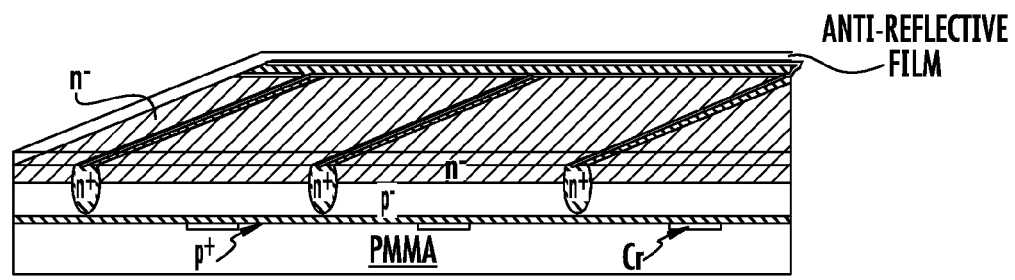

A final step, depicted in FIG. 32, may comprise depositing over the whole front side surface of the wafer-size photovoltaic cell module an antireflecting layer, for example a layer of titanium dioxide, in order to minimize yield losses caused by surface reflection.

As may be observed, according to this second embodiment, the active photovoltaic converting device is defined by a bilateral p⁻/n⁻ junction diode, wherein the relatively high resistivity of both epitaxially grown p⁻ and n⁻ layers ensures an even more extended depletion region than in the first described embodiment for an even higher cell efficiency.

The fabrication process of this invention exploits a technique of forming a detachable SOI layer on an originating or mother monocrystalline silicon wafer, from which the SOI layer is eventually detached in a simple and safe manner of outstandingly reduced cost compared to other more complex known techniques. The relatively low cost processing for forming a detachable SOI layer on an originating (mother) silicon wafer coupled with the fact that before detaching the SOI layer, an optical grade plastic film is laminated on the surface of the detachable layer thus providing a practical permanent mechanical support to the delicate SOI layer, ensures an overall economy of the fabrication process, thus substantially reducing the cost of the fabricated wafer-size photovoltaic cell modules.

Figure 33:
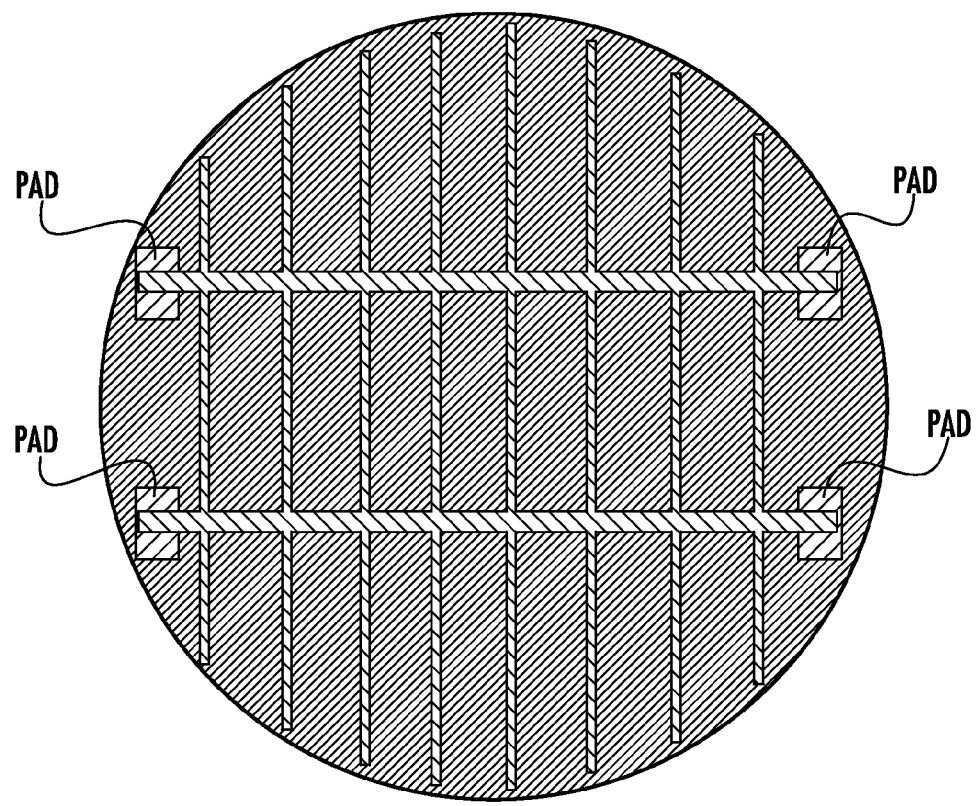
FIG. 33 illustrate the open layout of the current collecting terminals of the integrated photodiode structure in accordance with the invention.

FIG. 33 illustrates an example of the open layout of the deposited metal current collecting terminals that are formed on both the rear side (first terminal) and on the front side of the wafer size photovoltaic cell module (second terminal). The second terminal being formed on the polished separation surface of the epitaxially grown layer in which the cellular structure of the photodiode has been fully defined after having been separated from the cellular wafer.

Electrical interconnections according to a given series-parallel arrangement of a plurality of wafer-size photovoltaic cell modules to fabricate a photovoltaic conversion panel of a desired capacity may be realized with any of the currently used techniques. Metal wires or ribbons of a copper or aluminum foil may be "soldered" to the metallized areas (or pads) of the two terminals of the wafer-size photodiode using a polymerizable conductive resin solder (e.g. a conductive epoxy cement) or with any similar technique that does not require heating at temperatures exceeding the temperature tolerated by the plastic carrier fabric.

That which is claimed:

1. A method of fabricating a wafer-size photovoltaic cell module in an epitaxially grown monocrystalline silicon layer that is eventually detached from a surface of a monocrystalline silicon wafer, comprising:
defining an integrated cellular structure of a light converting diode in the epitaxially grown detachable layer including a first current collecting terminal of the diode;
laminating onto the epitaxially grown detachable layer a film of an optical grade plastic material resistant to a hydrofluoric acid solution;

immersing the wafer in the hydrofluoric acid solution causing detachment of the epitaxially grown silicon layer laminated with the film of optical grade plastic material; and polishing a surface of separation of the detached processed epitaxially grown layer and forming a second collecting terminal of the diode at a relatively low temperature tolerable by the film of optical grade plastic material.

2. The method of claim 1 wherein the light converting junction diode comprises a monolateral $p^+/n^-$ junction.

3. The method of claim 1 wherein the light converting junction diode comprises a bilateral $p^-/n^-$ junction.

4. The method of claim 1 wherein the film of optical grade plastic material comprises at least one of a polymethylmetacrylate material and a polycarbonate material, and has a thickness between about 0.5 and 1.5 mm.

5. The method of claim 1 wherein each of the first and second current collecting terminals include at least one pad area for electrical connection of the wafer-size photovoltaic cell module to a load.

6. The method of claim 5 wherein the first and second current collecting terminals each comprises an open layout including backbone lines and branch lines departing from a respective at least one electrical connection pad.

7. The method of claim 1 wherein the first current collecting terminal comprises a blanket layer of deposited metal covering a whole surface of the processed epitaxially grown detachable layer.

8. A method of fabricating a photovoltaic cell module from a detachable epitaxially grown monocrystalline silicon layer carried on a surface of a monocrystalline silicon wafer, comprising:

defining an integrated structure of a light converting junction diode in the detachable epitaxially grown layer including a first terminal of the diode;

affixing onto the detachable epitaxially grown layer a plastic film resistant to an etchant;

immersing the wafer in the etchant causing detachment of the detachable epitaxially grown silicon layer laminated with the plastic film; and polishing a separation surface of the detachable epitaxially grown layer and forming a second terminal of the diode thereon.

9. The method of claim 8 wherein the light converting junction diode comprises at least one of a monolateral and bilateral junction diode.

10. The method of claim 8 wherein the light converting junction diode comprises a monolateral $p^+/n^-$ junction.

11. The method of claim 8 wherein the light converting junction diode comprises a bilateral $p^-/n^-$ junction.

12. The method of claim 8 wherein the etchant comprises hydrofluoric acid.

13. The method of claim 8 wherein the plastic film comprises at least one of a polymethylmetacrylate material and a polycarbonate material.

14. The method of claim 8 wherein the first and second terminals each include at least one pad area for connecting the photovoltaic cell module to a load.

15. The method of claim 14 wherein the first and second terminals each comprises an open layout including backbone lines and branch lines departing from a respective at least one electrical connection pad.

16. The method of claim 8 wherein the first terminal comprises a metal layer covering the detachable epitaxially grown layer.

* * * * *

UNITED STATES PATENT AND TRADEMARK OFFICE
CERTIFICATE OF CORRECTION

| | | |
|---|---|---|
| PATENT NO. | : 8,124,865 B2 | Page 1 of 1 |
| APPLICATION NO. | : 11/280002 | |
| DATED | : February 28, 2012 | |
| INVENTOR(S) | : Montanini et al. | |

It is certified that error appears in the above-identified patent and that said Letters Patent is hereby corrected as shown below:

In the Specification

Column 7, Line 7          Delete: "am"
                          Insert: --μm--

Signed and Sealed this
Second Day of July, 2013

Teresa Stanek Rea
*Acting Director of the United States Patent and Trademark Office*